(12) United States Patent
Ma

(10) Patent No.: US 6,831,493 B2
(45) Date of Patent: Dec. 14, 2004

(54) DUTY CYCLE REGULATOR

(75) Inventor: Stanley Jeh-Chun Ma, Gloucester (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 10/382,856

(22) Filed: Mar. 7, 2003

(65) Prior Publication Data

US 2003/0151435 A1 Aug. 14, 2003

Related U.S. Application Data

(63) Continuation of application No. 09/978,905, filed on Oct. 18, 2001, now Pat. No. 6,566,925, which is a continuation of application No. 09/430,104, filed on Oct. 29, 1999, now Pat. No. 6,320,437.

(30) Foreign Application Priority Data

Oct. 30, 1998 (CA) ............................................. 2250538

(51) Int. Cl.[7] ............................................. H03K 3/017
(52) U.S. Cl. ........................... 327/175; 327/176; 331/40
(58) Field of Search ................................ 327/172–175, 327/176, 198, 299, 284, 230, 259; 365/233, 233.5

(56) References Cited

U.S. PATENT DOCUMENTS

| | | | |
|---|---|---|---|
| 3,748,895 A | * 7/1973 | Kummer et al. ............... | 73/611 |
| 4,675,546 A | 6/1987 | Shaw ......................... | 327/176 |
| 5,118,975 A | 6/1992 | Hillis et al. .................. | 327/150 |
| 5,146,300 A | 9/1992 | Hamamoto et al. ......... | 357/300 |
| 5,357,204 A | * 10/1994 | Knoll .......................... | 327/259 |
| 5,566,129 A | * 10/1996 | Nakashima et al. ...... | 365/233.5 |
| 5,638,016 A | 6/1997 | Eitrheim ..................... | 327/175 |
| 5,642,068 A | 6/1997 | Wojcicki et al. ............ | 327/172 |
| 5,642,082 A | * 6/1997 | Jefferson ..................... | 331/25 |
| 5,652,733 A | 7/1997 | Chen et al. ................. | 365/233 |
| 5,698,995 A | 12/1997 | Usami ......................... | 326/93 |
| 5,699,313 A | 12/1997 | Foss et al. .................. | 365/226 |
| 5,729,160 A | 3/1998 | Allan .......................... | 327/54 |
| 5,757,218 A | * 5/1998 | Blum ......................... | 327/175 |
| 5,774,699 A | 6/1998 | Nagae ........................ | 713/400 |
| 5,777,501 A | 7/1998 | AbouSeido ................. | 327/274 |
| 5,796,673 A | 8/1998 | Foss et al. .................. | 365/233 |
| 5,949,696 A | 9/1999 | Threewitt .................... | 365/49 |
| 6,081,144 A | * 6/2000 | Usuki et al. ................ | 327/230 |

* cited by examiner

*Primary Examiner*—Minh Nguyen
(74) *Attorney, Agent, or Firm*—L. Anne Kinsman; Borden Ladner Gervais LLP

(57) ABSTRACT

A duty cycle regulator derives from an input clock of arbitrary duty cycle, an output clock having an adjustable duty cycle of similar frequency. The duty cycle regulator includes a bistable circuit for receiving an input clock pulse and providing the output clock, coupled through a feedback loop to an adjustable delay unit having a delay interval equal to an adjustable fraction of the input clock period. When an input clock pulse is received, the bistable circuit is set, providing a high signal to the delay unit, after which the delay interval resets the bistable circuit to provide a low signal. The delay unit includes two charge pumps alternately feeding and draining electric charges into and from a low-pass filter. The delay interval can be adjusted to a desired duty cycle independent of the input clock frequency, by setting the ratio of electric currents through the two charge pumps.

17 Claims, 9 Drawing Sheets

DUTY CYCLE REGULATOR

This application is a continuation of U.S. patent application Ser. No. 09/978,905 filed Oct. 18, 2001; now U.S. Pat. No. 6,566,925, which is a continuation of U.S. patent application Ser. No. 09/430,104 filed Oct. 29, 1999, now U.S. Pat. No. 6,320,437.

FIELD OF THE INVENTION

The invention relates to the regulation of a clock duty cycle for use in conjunction with Very Large Scale Integration (VLSI) microelectronic circuits.

BACKGROUND OF THE INVENTION

In the field of VLSI microelectronic circuits, many digital systems require a certain clock duty cycle (i.e. 50/50%, 40/60%) for proper operation. However, such clock duty cycles are not always readily available. A clock with an inappropriate duty cycle may cause the digital system to fail or force the system to run at a lower clock speed. Although many digital systems desire a 50/50% duty cycle, not all digital systems necessarily desire the same clock duty cycle. Depending on the source of the clock, the duty cycle may not always be known or predictable. Hence, duty cycle correction is needed.

One such approach to duty cycle correction is to use a phase-locked loop to synthesize a clock at double the input frequency, and then to divide down by two to obtain a 50/50% duty cycle. This approach requires the building of a phase-locked loop, which is complex in design, large in area, and high in power. This approach also only limits the output duty cycle to 50/50%.

In U.S. Pat. No. 5,317,202, Waizman discloses a 50% duty-cycle clock generator, which is limited to generating only a 50% duty cycle and its implementation complicated. In U.S. Pat. No. 5,572,158, Lee et al describe an amplifier circuit with active duty cycle correction to produce a predetermined duty cycle. However, such a circuit uses three operational amplifiers, thus being relatively high in power consumption and large in area. In U.S. Pat. No. 5,757,218, Blum describes a circuit and a method for signal duty cycle correction, which involves the use of a ring oscillator counter to produce adjustable delays. In order for this approach to have sufficient duty cycle resolution, the ring oscillator must operate at a frequency much higher than the input clock, meaning a large use of power. Lower operating speeds would mean degradation in the duty cycle resolution.

In U.S. Pat. No. 5,550,499, Eitrheim describes an adjustable duty cycle clock generator using multiplexers to adjust the delay in a delay line. The problem with this approach is that the amount of delay needed is not known by the circuit and must be determined elsewhere either through measurement or other dynamic means. This circuit cannot self-correct for the appropriate duty cycle. In U.S. Pat. No. 5,617,563, Banerjee et al describe a duty-cycle independent tunable clock that uses an adjustable delay line in conjunction with a flip-flop. However, the described circuit is limited by using a fixed delay, once adjusted (by blowing out fuses through a laser), thereby providing a duty cycle for a given adjustment which directly depends on the clock input. Furthermore, the use of blowing out fuses for changing the duty cycle is relatively expensive and demands a larger overall circuit. Once the fuses are set to provide a desired duty cycle for a particular clock frequency, they cannot be changed again to operate with a different frequency or to obtain a different duty cycle.

In U.S. Pat. No. 5,477,180, Chen describes a circuit and a method for generating a clock signal wherein the duty cycle is adjusted independent of the input clock frequency by adjusting a bias voltage at the driver circuit of the output clock, which is driven by the input clock. This bias voltage is generated by a differential amplifier driven by two voltage-adjusted inputs using two adjustable tapped resistors. In Chen's approach, however, at least one operational amplifier and four resistors are required resulting in a relatively large circuit area and high power. Furthermore, the resulting output clock signal is shaped by an RC time constant giving relatively long rise/fall times, especially when duty cycles far beyond 50/50% are desired. Chen teaches that for duty cycles far beyond 50/50%, a few of the described circuits can be cascaded for better rise/fall times. This would require more operational amplifiers and more resistors, hence larger circuit size and greater power consumption. Moreover, there is no provision in Chen's approach for adjusting the duty cycles 'on the fly', i.e. whenever desired by the user.

In view of the limitations of the prior art reviewed above, it would be desirable to provide an economical circuit and method for regulating a steady state clock duty cycle over a relatively wide range of selectable duty cycles, without being dependent on an actual input clock frequency value.

SUMMARY OF THE INVENTION

An object of this invention is to provide a duty cycle regulator for providing an output clock signal having a preselected duty cycle.

In accordance with an aspect of the present invention, there is provided a duty cycle regulator for providing an output clock signal having a pre-selected duty cycle. The duty cycle regulator includes a clock pulse generator, a flip-flop circuit and a delay circuit. The clock pulse generator has a clock edge detector for generating a clock pulse signal in response to a leading edge of an input clock signal. The flip-flop circuit has a set input coupled to the clock pulse signal, a reset input coupled to a reset signal, and an output port for providing the output clock signal. The delay circuit receives the input clock signal and the output clock signal for generating the reset signal after the flip-flop-circuit is set to a first state, and the reset signal has an adjustable duration which is a fraction of the period of the input clock signal.

In accordance with another aspect of the present invention, there is provided a duty cycle regulator for providing an output clock signal having a predetermined duty cycle. The duty cycle regulator includes a clock pulse generator, a flip-flop circuit, and a delay circuit. The clock pulse generator has a clock edge detector responsive to a leading edge of an input clock signal, where the clock pulse generator provides a pulse signal when the leading edge is detected. The flip-flop circuit has a set input port for receiving the pulse signal, a reset input coupled to a reset signal, and an output port for generating the output clock signal. The delay circuit receives the output clock signal and generates the reset signal after an adjustable time delay determined by the duty cycle of the output signal and control current, such that the delay circuit generates the reset signal after the flip-flop-circuit is set to a first state.

In accordance with yet another aspect of the present invention, there is provided a pulse generator circuit for generating an adjustable duration pulse. The pulse generator includes a first transistor, a second transistor, an amplifier, and a third transistor. The first transistor has its source coupled to a voltage supply, its drain coupled to a first node, and its gate coupled to a clock signal. The second transistor has its source coupled to the first node, its drain coupled to a third transistor, and its gate coupled to the clock signal. The amplifier is coupled to the first node for providing the adjustable duration pulse, and the amplifier has a predetermined threshold voltage. The third transistor has its source coupled to a ground potential, and its gate coupled to a voltage control signal, such that the voltage control signal is responsible for lowering a voltage potential on the first node to a voltage lower than the predetermined threshold voltage.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Exemplary embodiments of the invention will now be further described with reference to the drawings in which.

DETAILED DESCRIPTION

Figure 1:
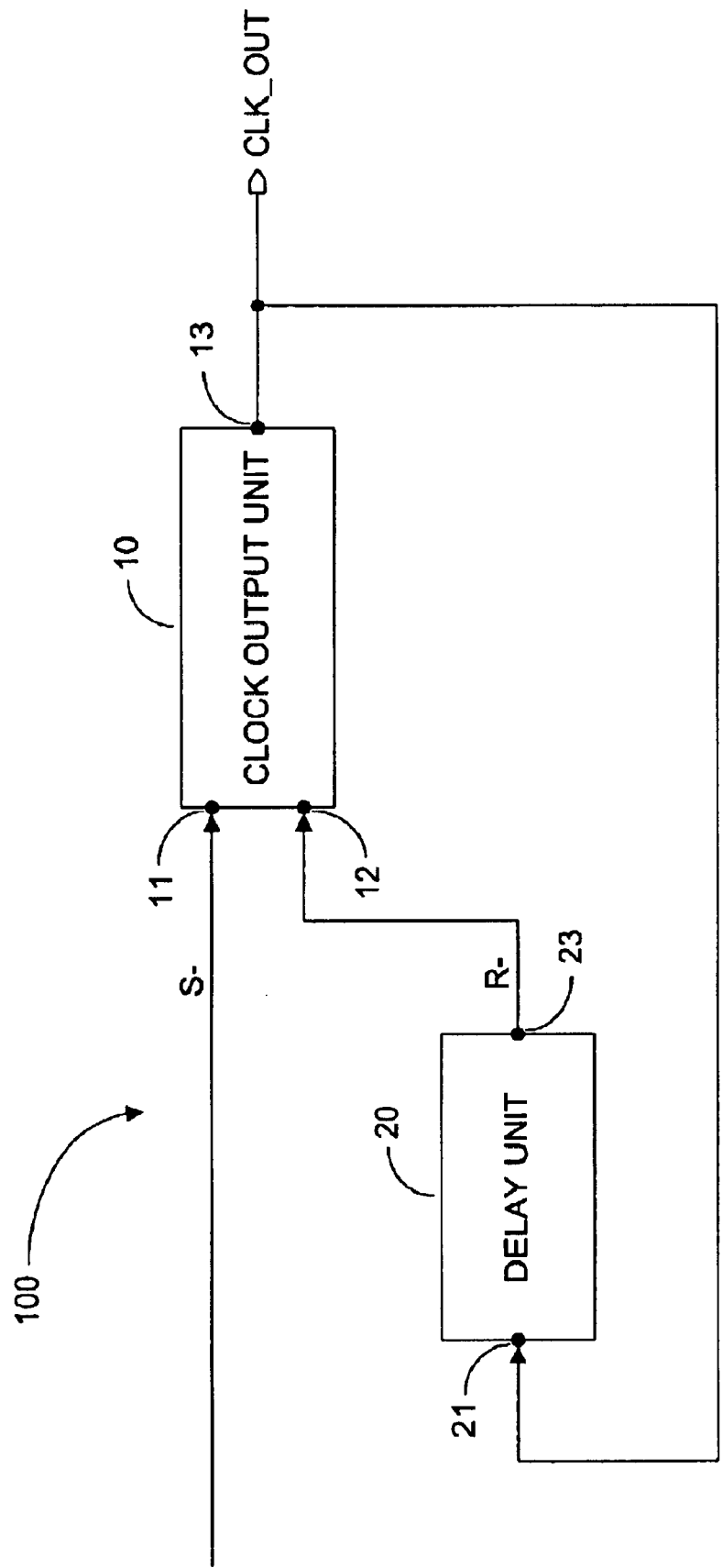
FIG. 1 illustrates in a top-level block diagram of a duty cycle regulator in accordance with an embodiment of the present invention.

FIG. 1 illustrates in a block diagram a duty cycle regulator 100 in accordance with an embodiment of the present invention. In this embodiment a clock output unit (means) 10 is provided, which has a first bistable input port 11, and a second bistable input port 12 and an output clock port 13. The output port 13 is coupled to an input port 21 of a delay unit (means) 20 which has an output port 23 coupled to the second bistable input port 12. When the clock output unit 10 receives a pulse at its first (set) input port 11, it switches to a first (set) state thereby providing a high level output clock signal CLK_OUT at its output clock port 13. The output clock signal CLK_OUT remains high until another pulse is received at its second (reset) input port 12 to switch the output clock unit 10 back to a second (reset) state, thereby providing a low level output clock signal at its clock output port 13.

In this embodiment, the duty cycle regulator 100 operates as follows. When an input clock pulse S− having a given input clock period is applied to the bistable input port 11, the clock output means 10 is set, thereby giving a high level at its output port 13. A transition in this direction in CLK_OUT is detected by the delay unit 20 at its input port 21, which will then provide a delayed pulse R− at its outport port 23 after a certain delay interval equal to a pre-selected fraction of the input clock period. This way the duty cycle of CLK_OUT is regulated in accordance with the value of such pre-selected fraction regardless of the frequency of the input clock pulse S−.

The embodiment shown in FIG. 1 lends itself to an integrated circuit design. However, other implementations of the same approach described above are also possible, such as by way of using software or firmware techniques, or even electrical or electronic circuits using discrete components for implementing the two blocks 10 and 20 (shown in FIG. 1).

Figure 2:
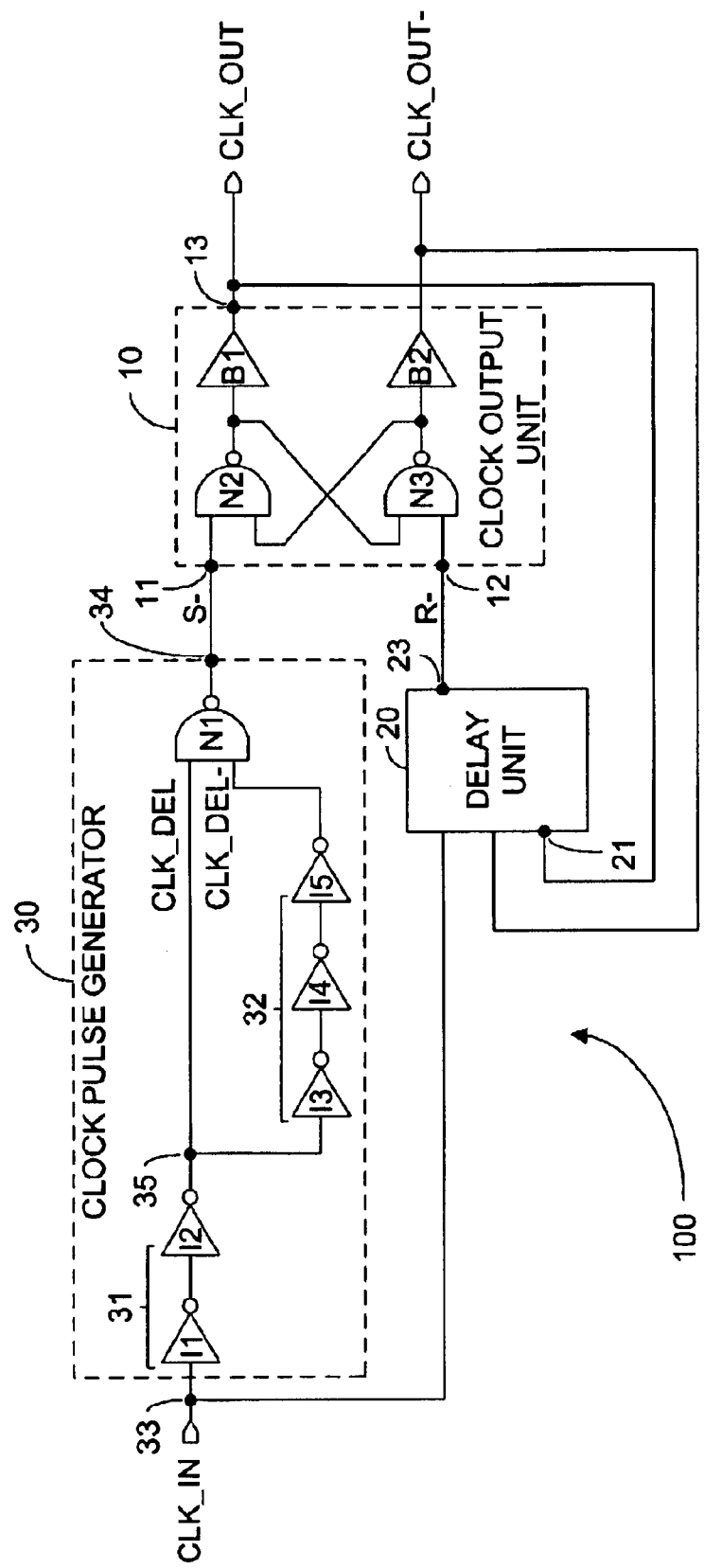
FIG. 2 illustrates circuit details of the pulse generator and the bistable circuit shown in FIG. 1.

FIG. 2 illustrates in a block diagram a duty cycle regulator 100 in accordance with a preferred embodiment of the present invention, which is designed to operate using an external (input) clock signal CLK_IN having an arbitrary duty cycle to be received by clock pulse generator means 30. The clock pulse generator 30 includes a first series of two delay inverters I1 and I2 which receive CLK_IN at a first input port 33 (I1 input) which provides a delayed first clock signal CLK_DEL at a first output port 35 (I2 output). The CLK_DEL signal is then fed to a first of a second series of three delay invertors I3, I4 and I5, which provide a further delayed second clock signal CLK_DEL− at a second output port (I5 output). The two clock signals CLK_DEL and CLK_DEL− are then fed to two respective inputs of logic means N1 in the form of an inverting AND (NAND) gate N1 to generate a negative input clock pulse S−, when CLK_DEL and CLK_DEL− overlap with one another by having a high level at the same time.

In the preferred embodiment of FIG. 2, the clock output means 10 is a bistable circuit in the form of an R/S flip-flop composed of NAND gates N2 and N3. As shown in the timing diagram of FIG. 4, this negative pulse S− when applied to the first bistable input port 11 will set the R/S flip-flop causing the output clock signal CLK_OUT at the output clock port 13 to rise from a logic low level to a logic high level. This output clock signal is fed back to an input port 21 of the adjustable (or programmable) delay unit 20. When CLK_OUT goes high, the delay unit 20 in turn detects a transition in such a direction in CLK_OUT and generates a negative delayed pulse R− provided to a second bistable input port 12 upon termination of a time delay interval, which is a pre-selected fraction of the input clock period, causing CLK_OUT to fall from high to low. CLK_OUT will remain low until the next negative delayed clock pulse S− appears at first input port 11, thus completing one full clock cycle. The duty cycle of CLK_OUT depends on the length of delay interval that the delay unit 20 introduces between the time CLK_OUT goes high and the time a negative delayed clock pulse R− is provided to the second input port 12. In the circuit of FIG. 2, the inverters I1 and I2 provide a buffer and a delay for the external clock signal CLK_IN to facilitate the operation of the variable delay circuit as will be described further below.

Figure 3:
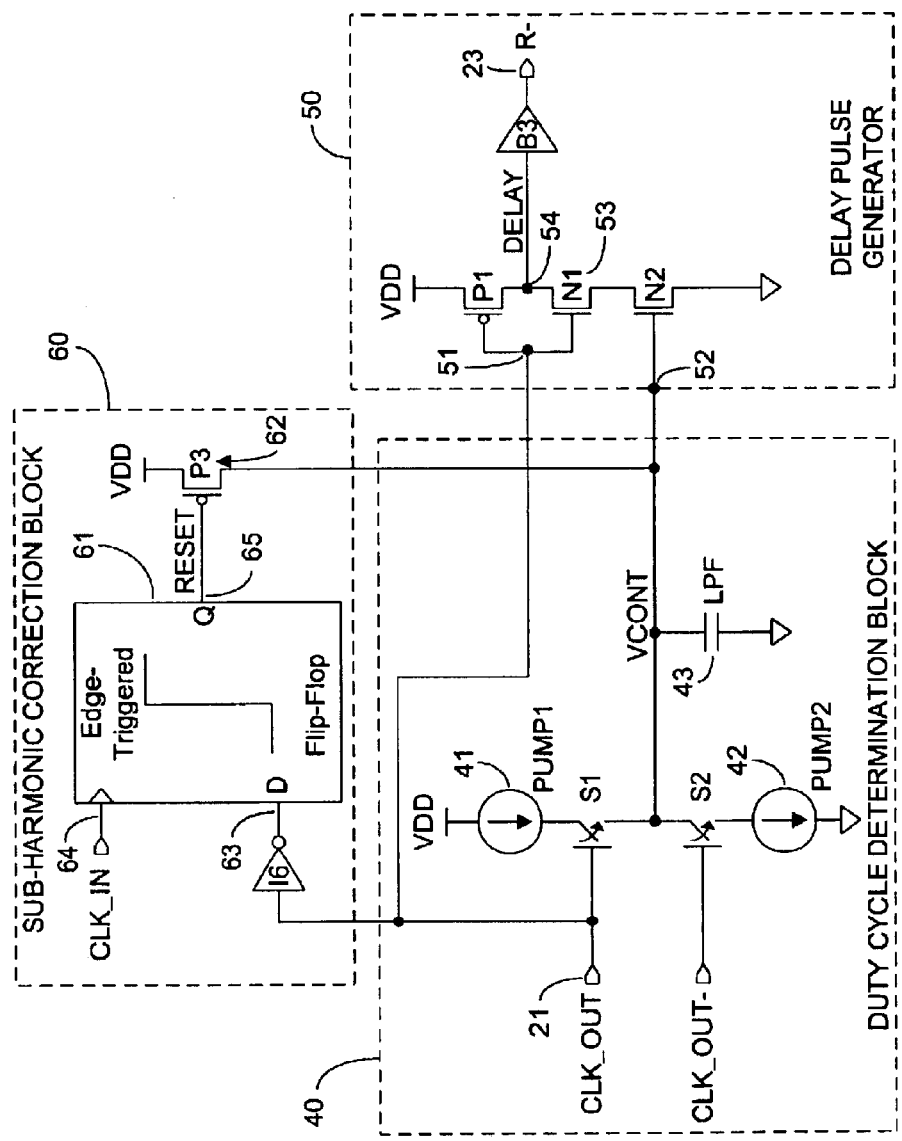
FIG. 3 illustrates in a circuit diagram, the variable delay circuit of FIG. 1.

FIG. 3 illustrates the design of the adjustable delay unit 20 according to an embodiment of the present invention. It includes three major blocks: a duty cycle determination block 40, delay pulse generator block 50, and sub-harmonic correction block 60. Within the duty cycle determination block 40, two charge pumps 41 (PUMP1) and 42 (PUMP2) are alternately turned on and off by level changes in the output clock signal CLK_OUT and an inverted output clock signal CLK_OUT-, via first and second switching means S1 and S2 respectively, together with a low-pass filter 43 (LPF), which in this embodiment has the form of a capacitor. The duty cycle determination block 40 controls a delay control signal in the form of a voltage VCONT, which in turn controls the actual delay of the delay pulse generator 50 made up by the current-starved inverter 53 composed of PMOS transistor P1, and NMOS transistors N1 and N2. Within the sub-harmonic correction block 60, an edge-triggered bistable circuit 61, in the form of a D-type flip-flop, eliminates the possibility of the duty cycle regulator locking into a sub-harmonic of the input frequency, i.e. any clock period which is different from the input clock period.

The signals CLK_OUT and CLK_OUT- control the voltage VCONT by causing one charge-pump 41 to feed (source) and the other 42 to drain (sink) electric charges alternately into and out of the capacitor 43. The ratio of the two respective charge-pump currents is set in accordance with a desirable ratio of the duration of times that the pumps are turned on and off. For example, if the duty cycle is to be 40/60%, then the currents through PUMP1 and PUMP2 will also have 40/60 (2/3) ratio respectively. The setting of the charge-pump ratio, therefore, effectively sets the output clock's duty cycle. When the circuitry within the duty cycle determination block 40 is in 'lock' (it takes some time for this circuit to achieve a steady state final duty cycle value), the average voltage VCONT should be constant by virtue of the self-regulating low-pass filter 43. On the other hand, if the currents in PUMP1 and PUMP2 were identical, then the only way VCONT can stay constant is when CLK_OUT and CLK_OUT- are high for an identical duration of time, hence, implying a 50/50% duty cycle.

The delay pulse generator 50 includes a current starved inverter 53 followed by a buffer B3. This portion of the circuit receives VCONT and CLK_OUT at its input ports 51 and 52 respectively and provides at its middle port 54 a signal DELAY, and then becomes R- at the delay unit output port 23, which is then fed back as CLK_OUT to the delay unit input port 21 after passing through the output clock unit 10.

In operation, when CLK_OUT goes high, the middle port 54 tries to go low. However, since the NMOS transistor N2 is not fully on due to the value of VCONT, the fall time of the signal DELAY at the middle port 54 of the current-starved inverter is slow when compared to other digital signals within the duty cycle regulator system 100. When the signal DELAY goes low below the threshold of buffer B3, R- also goes low, forcing CLK_OUT to go low due to the reset action of the output clock unit 10 of FIG. 2. When fed-back CLK_OUT signal goes low, the signal DELAY is rapidly pulled high by the transistor P1. As there are no transistors in series with the PMOS transistor P1, the signal DELAY eventually pulls high quite rapidly as opposed to when it is being pulled low. The behavior of the current-starved inverter 53 in conjunction with a delay in the buffer B3 is effectively what determines the delay interval marked as the inteval between the time CLK_OUT goes high and the time a negative delayed pulse R- is generated at the delay unit output port 23. The buffer delay is constant. The delay caused by the current-starved inverter is determined by the resistance of the NMOS transistor N2 which in turn is determined by the voltage VCONT from the duty cycle determination block 40.

The sub-harmonic correction block 60 includes an inverter 16, an edge-triggered flip-flop circuit 61, and a PMOS transistor P3. The flip-flop circuit 61 has a D-input 63 coupled to receive the output clock signal CLK_OUT via the inverter 16, and a trigger input 64 coupled to receive the input clock signal CLK_IN and an output port 65 for providing a reset signal RESET. The signal RESET is generated by the flip-flop circuit 61 upon detecting a positive level transition in CLK_IN simultaneous to CLK_OUT being low.

Without sub-harmonic correction, the duty cycle regulator 100 may arrive at a stable state in which the output clock is a sub-harmonic of the input clock. This may occur if at power-up, the voltage VCONT is initially at a relatively very low level. Under normal operations, when CLK_IN goes high, it is usually expected that CLK_OUT is currently low. However, under sub-harmonic conditions, there are instances where CLK_IN is high at the same time as CLK_OUT is high. If this event shall occur, the edge-triggered flip-flop circuit 61 through inverter 16 will cause a low binary level signal RESET- output port 65 of the flip-flop circuit 61 to appear, causing a driver 62 in the form of a PMOS transistor P3 to pull VCONT up to VDD voltage. When VCONT is at VDD voltage, the current-starved inverter 53 in the delay pulse generator 50 has the least delay. On the subsequent clock cycle triggered by CLK_IN, RESET- is returned to high and the duty cycle regulator 100 returns to normal operation. Hence, sub-harmonics are eliminated, under such circumstances.

The inverters I1 and I2 within the clock pulse generator 30 shown in FIG. 2 serve to delay somewhat the rising edge of CLK_OUT with respect to CLK_IN to facilitate the operation of the sub-harmonic correction circuit 60, which samples CLK_OUT on the positive edge of CLK_IN. If CLK_OUT is sampled as high, then a sub-harmonic is detected to exist because CLK_OUT's period is greater than one CLK_IN clock cycle. However, if CLK_OUT is sampled as low, then a sub-harmonic is detected as non-existent, and the sub-harmonic correction circuit 60 is effectively inactive. To ensure that the sub-harmonic correction circuit 60 samples CLK_OUT correctly, some margin is desirable between the time CLK_IN rises and the time CLK_OUT rises, which is provided by the inverters I1 and I2. Furthermore, the inverter 16 in the sub-harmonic correction block 60 shown in FIG. 3 serves a similar purpose in the sense that it further delays the inverted rising edge of CLK_OUT into the sub-harmonic correction circuit.

Figure 4:
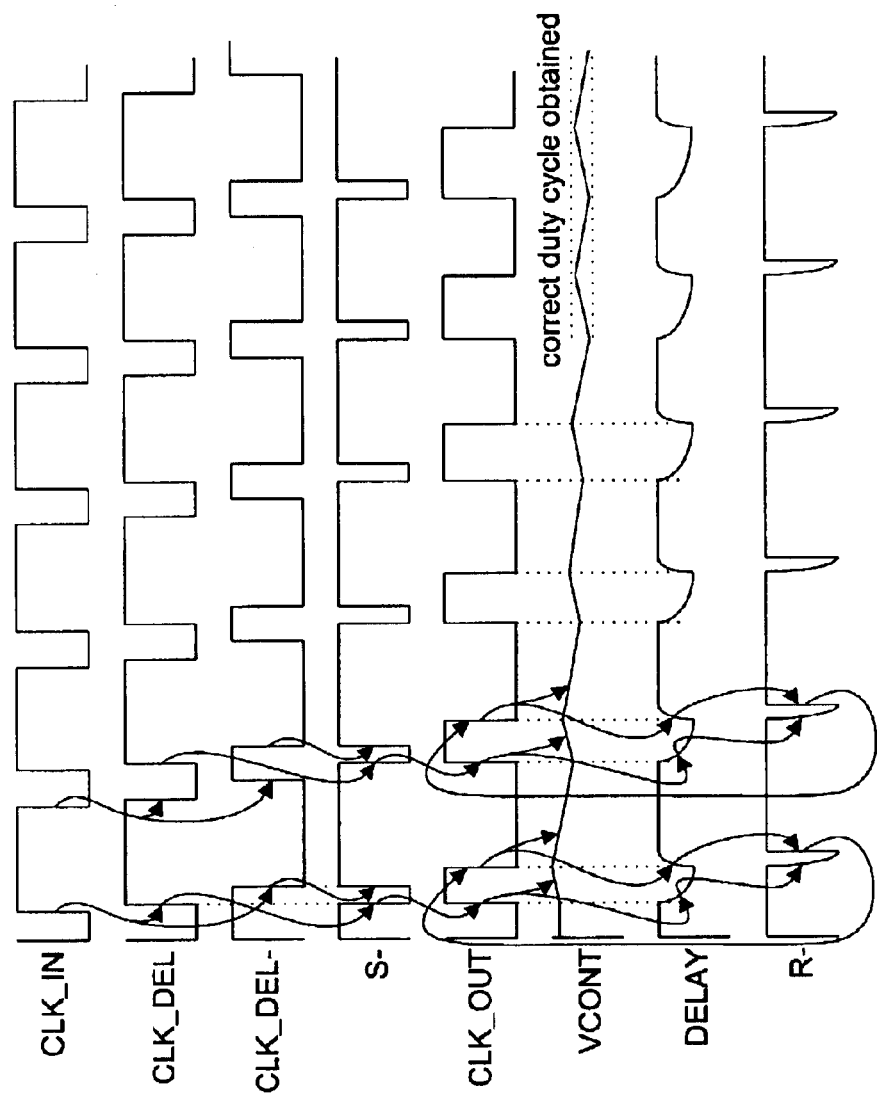
FIG. 4 illustrates in a timing diagram typical signal waveforms during a normal operation of the duty cycle regulator shown in FIGS. 2 and 3.

FIG. 4 illustrates the waveforms of the duty cycle regulator under normal operation. With reference back to FIG. 2, the operation during normal conditions will now be explained. In FIG. 4, the input clock CLK_IN is shown to have a 75/25% duty cycle, possibly an undesirable duty cycle for a particular operation.

For the purpose of illustration, the duty cycle regulator in accordance with the present invention is shown to be pre-set for correcting the duty cycle to 50/50%. As shown in FIG. 2, CLK_DEL is a slightly delayed version of CLK_IN through inverters I1 and I2 while CLK_DEL- is an even further inverted version of CLK_DEL, delayed through inverters I3, I4 and I5. At the input of NAND gate N1, there is a brief period of time in which both CLK_DEL and CLK-DEL- are high, hereby providing a negative clock pulse S-. This causes CLK_OUT to go high every time S- goes low. The duty cycle is then interactively adjusted by the duty cycle determination block 40 and the delay pulse generator 50. Specifically, when CLK_OUT goes high, PUMP1 in the duty cycle determination block 40 is turned on, charging up VCONT. At the same time, DELAY is being pulled low. When DELAY has been pulled below the threshold voltage of buffer B3, R- goes low, causing CLK_OUT to go low through the R/S flip-flop 10. When CLK_OUT is low, PUMP2 is turned on via switching means S2, pulling VCONT lower. It is to be noticed that at the start of the next rising edge of CLK_OUT, VCONT is then lower than the previous edge. This is due to the fact that the current duty cycle of CLK_OUT is not high for a sufficient length of time. A lower VCONT would mean a longer delay in the delay pulse generator 50 inside the delay circuit 20, causing the next clock cycle of CLK_OUT to be high for a longer time. Utilizing this iterative feedback system, CLK_OUT eventually approaches a 50/50% duty cycle, as shown in FIG. 4. Once it does, the voltage VCONT is bounded and its average voltage is constant. The currents through PUMP1 and PUMP2 are equal at this time. Note that for illustration purposes, the figure shows that 'lock' is achieved in several clock cycles. In an actual practical design, this process will take many more clock cycles.

Figure 5:
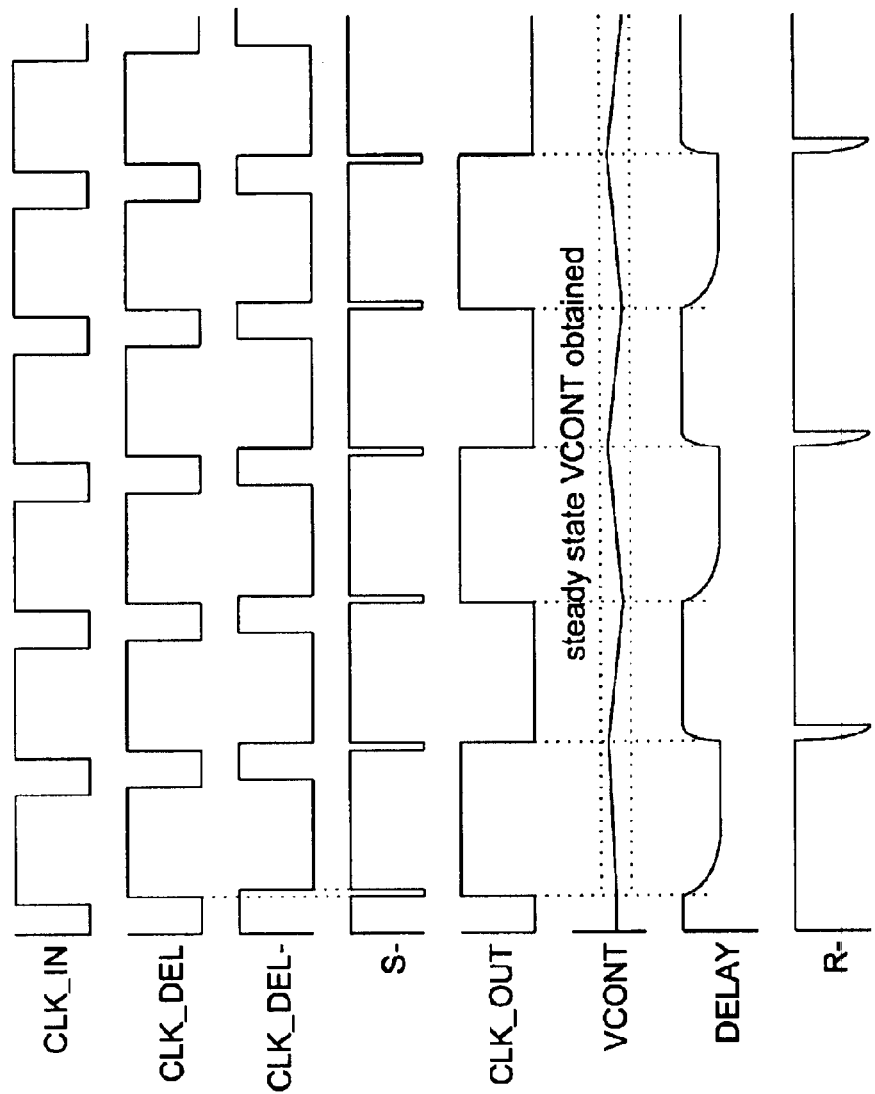
FIG. 5 illustrates in a timing diagram signal waveforms during an operation of the duty cycle regulator in FIGS. 2 and 3, in absence of sub-harmonic locking correction.

FIG. 5 illustrates in a timing diagram what might happen should a sub-harmonic correction block 60 not be included in the design of the delay circuit 20. Here CLK_OUT is noted to be at half the frequency of CLK_IN with a falling edge just past the negative clock pulse of S−. This circuit is in 'lock' condition because VCONT has reached a steady state average voltage.

Figure 6:
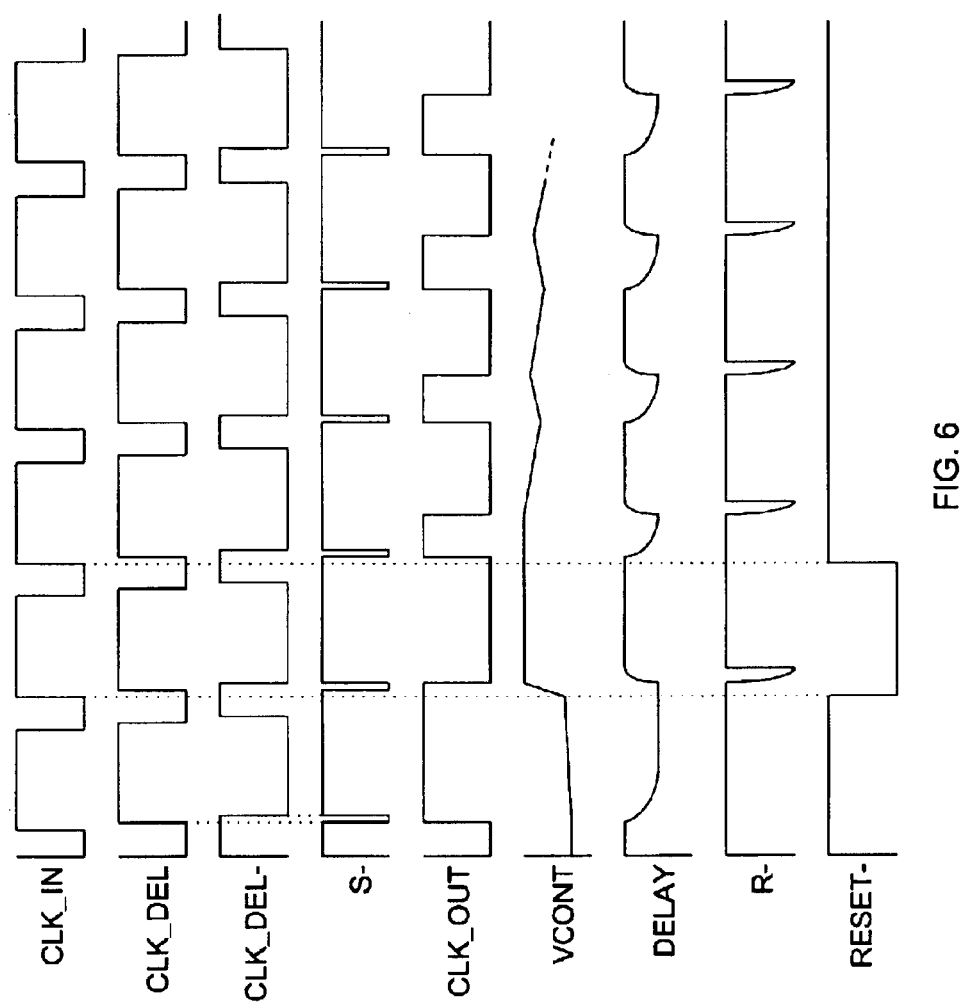
FIG. 6 illustrates in a timing diagram the effect of using sub-harmonic locking correction on signal waveforms during an operation of the duty cycle regulator in FIGS. 2 and 3.

FIG. 6 illustrates that with the sub-harmonic correction block 60 added in, at the rising edge of CLK-IN, this block detects that CLK_OUT is still high. This causes the output RESET− of the edge-triggered flip-flop 61 to go low, pulling VCONT to VDD. On the next clock cycle, RESET− is high again and the system is back under normal operational conditions.

Figure 7:
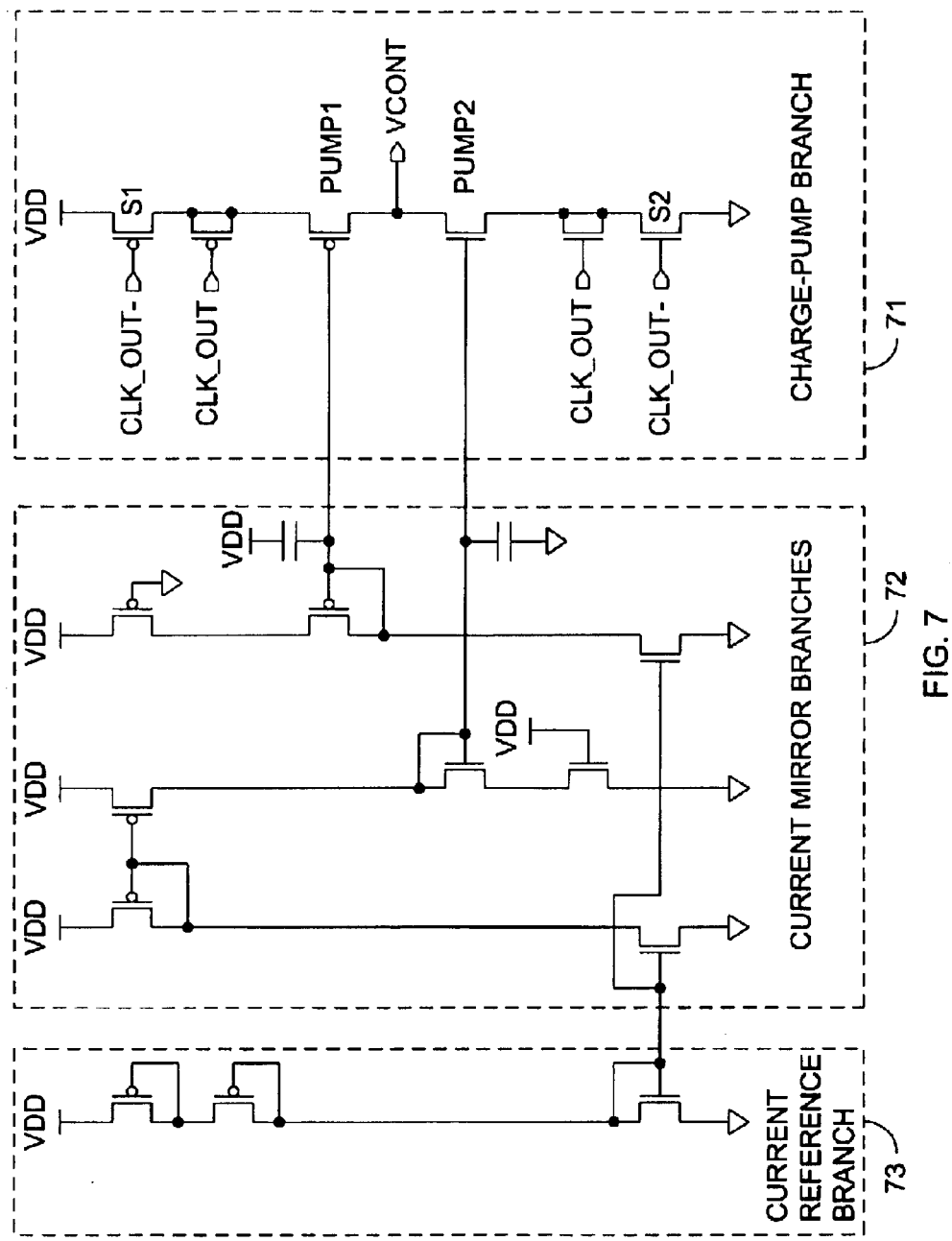
FIG. 7 illustrates in a circuit diagram the charge pumps and switching means shown in FIG. 3 in accordance with another embodiment of the present invention.

In FIG. 7, typical circuit details as readily available in the art are illustrated for the charge pumps PUMP1 and PUMP2 and the switching means S1 and S2 shown in FIG. 3 within the duty cycle determination block 40. In FIG. 7, the charge pumps PUMP1 and PUMP2 and the switching means S1 and S2 are shown as part of a charge-pump branch 71, where the currents flowing through PUMP1 and PUMP2 are controlled by current mirror branches 72, and a current reference branch 73.

Figure 8:
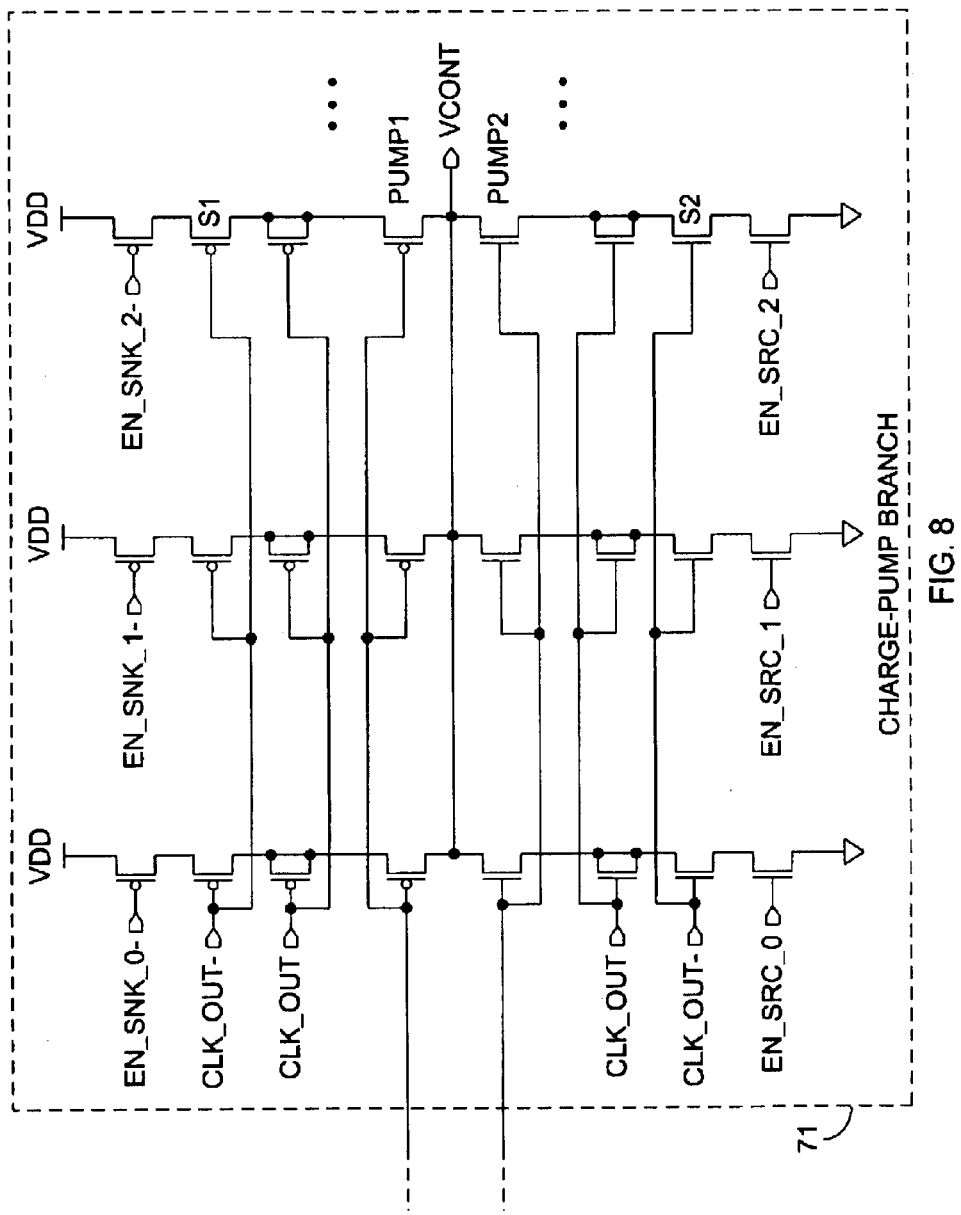
FIG. 8 illustrates in a circuit diagram an alternative embodiment of charge pumps and switching means shown in FIG. 3 to provide a programmable duty cycle.

In alternative embodiments, the charge-pump currents can be made to be adjustable or programmable on the fly by having multiple current branches in parallel within the charge-pump branch 71 as illustrated in FIG. 8. FIG. 8 is a circuit diagram of an alternative embodiment of the charge pumps and switching means shown in FIG. 3 to provide a programmable duty cycle. In this fashion, the duty cycle can be changed by selectively turning on and off particular combinations of these current branches through the sink and source signals EN_SNK0−, 1−, 2−, etc. and EN_SRC0, 1, 2, etc. as shown in FIG. 8.

In alternative embodiments, the charge pumps 41 and 42 can be implemented in any one of a number of different ways, including a standard push-pull charge-pump, and many other charge-pump designs that exist in current open literature without departing from the scope of this invention. Similarly many design variations are available in the art for implementing the edge-triggered flip-flop 61 in alternative embodiments.

Figure 9:
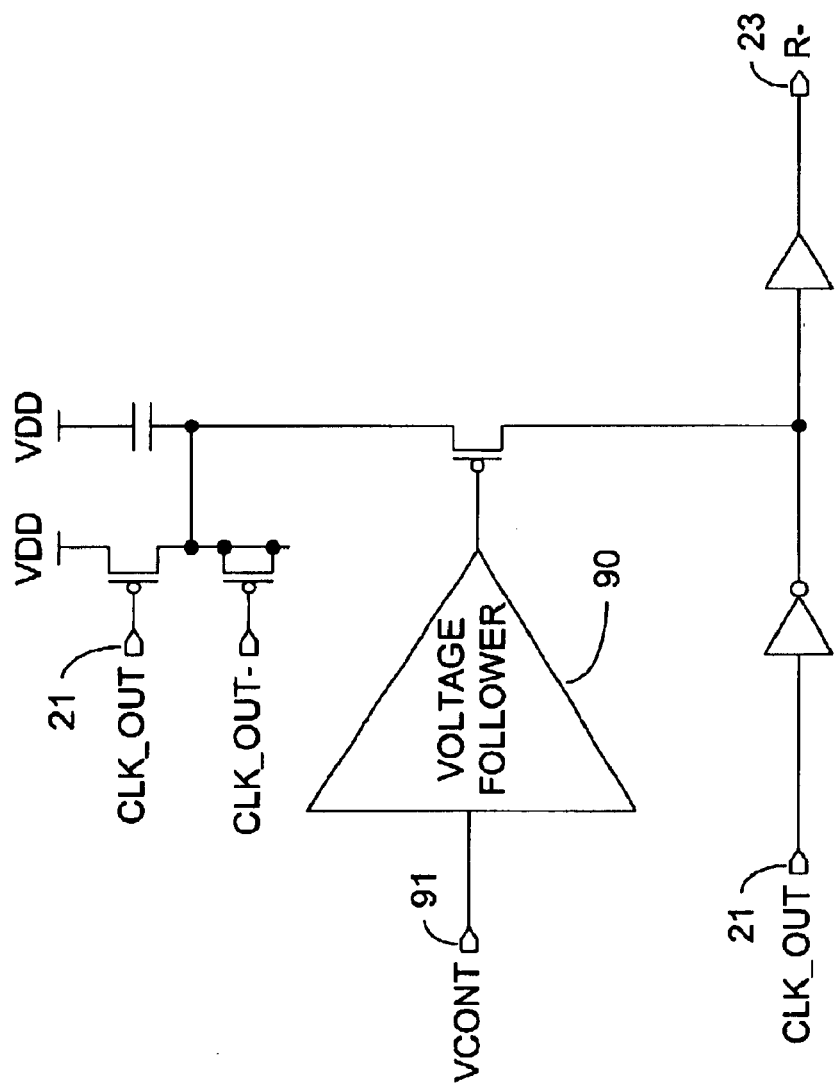
FIG. 9 illustrates in a circuit diagram an alternative embodiment for the design of the delay pulse generator shown in FIG. 3, using an operational amplifier.

Variations in the design of the delay pulse generator 50 shown in FIG. 3 for making use of the control voltage VCONT are also available in the art. One such design is shown FIG. 9 which uses an operational amplifier 90 in a voltage follower configuration. FIG. 9 illustrates a circuit diagram of an alternative embodiment for the design of the delay pulse generator shown in FIG. 3, using an operational amplifier. In this configuration, CLK_OUT is applied to the delay unit input port 21 and VCONT to the voltage follower input port 91, wherein the delayed pulse R− is generated at the delay unit output port 23.

Although the present invention has been described with particular reference to certain referred embodiments thereof, numerous variations and particular adaptations can be applied to the particular embodiments of the invention described above, without departing from the spirit and scope of the invention, which is defined in the claims.

Furthermore, the above embodiments are described with a particular reference to a hardware implementation using integrated circuit design, the invention as claimed can be put to practice by a person skilled in the art via a firmware or a software implementation of its various functional blocks as described above and defined in the claims.

What is claimed is:

1. A duty cycle regulator for providing an output clock signal having a pre-selected duty cycle, said duty cycle regulator comprising:

a clock pulse generator having a clock edge detector for generating a clock pulse signal in response to a leading edge of an input clock signal;

a flip-flop circuit having a set input coupled to the clock pulse signal, a reset input coupled to a reset signal, and an output port for providing the output clock signal; and a delay circuit receiving the input clock signal and the output clock signal for generating the reset signal after the flip-flop-circuit is set to a first state, the reset signal having an adjustable duration which is a fraction of the period of the input clock signal.

2. The duty cycle regulator of claim 1, wherein said clock pulse generator includes at least one first delay inverter having a first input port adapted to receive said input clock signal, and a first output port, at least one second delay inverter having a second input port coupled to the first output port, and a second output port, and logic means having two input ports coupled to the first and second output ports respectively, said logic means providing a logic AND operation to generate said clock pulse signal.

3. The duty cycle regulator of claim 1, wherein the flip-flop circuit includes a pair of cross-coupled logic gates, one of the cross-coupled logic gates having a set input for receiving the clock pulse signal and the other cross-coupled logic gate having a reset input for receiving the reset signal.

4. The duty cycle regulator of claim 1, wherein the delay circuit includes a duty-cycle determination circuit for receiving the output clock signal, and for generating a corresponding delay control signal in response to the output clock signal, and a delayed pulse generator circuit for receiving said delay control signal and the output clock signal, for providing the reset signal.

5. The duty cycle regulator of claim 4, wherein the delay circuit further includes a sub-harmonic correction circuit for receiving the input clock signal and the output clock signal, the sub-harmonic correction circuit driving said delay control signal to a voltage level.

6. The duty cycle regulator of claim 5, wherein the sub-harmonic correction circuit includes an edge-triggered flip-flop circuit having a D-input for receiving the output clock signal, a trigger input for receiving the input clock signal, and an output port for providing a control signal, and a driver receiving the control signal for coupling the voltage level to the delay control signal in response to the control signal, the control signal being generated when the input clock signal and the output clock signal are at the same logic level.

7. The duty cycle regulator of claim 4, wherein the duty-cycle determination circuit includes a low pass filter, a first charge pump for feeding electric charge into said low-pass filter, a second charge pump for draining electric charge out of said low-pass filter, first and second switching means for respectively and alternately turning, said first and second charge pumps on and off in response to level changes in the output clock signal, the delay control signal being generated at the low-pass filter.

8. The duty cycle regulator of claim 7, wherein said fraction of the period of the input clock signal is adjustable by setting a predetermined ratio of electric currents of the first charge pump relative to the second charge pump.

9. The duty cycle regulator of claim 4, wherein the delayed pulse generator circuit includes a current-starved inverter having two input ports coupled to receive the output clock signal and the delay control signal respectively, and a middle port for driving a buffer circuit, the reset signal being generated when the delay control signal reaches a predetermined threshold subsequent to a change in the logic level of the output clock signal.

10. A duty cycle regulator for providing an output clock signal having a final desired duty cycle, comprising:

a clock pulse generator having a clock edge detector responsive to a leading edge of an input clock signal, the clock pulse generator providing a clock pulse signal when the leading edge is detected, the clock pulse generator including at least one first delay inverter having a first input port adapted to receive said input clock signal, and a first output port, at least one second delay inverter having a second input port coupled to the first output port, and a second output port, and, logic means having two input ports coupled to the first and second output ports respectively, said logic means providing a logic AND operation to generate said clock pulse signal;

a flip-flop circuit having a set input port for receiving the clock pulse signal, a reset input coupled to a reset signal, and an output port for generating the output clock signal; and a delay circuit for receiving the output clock signal and generating the reset signal after a time delay, the time delay being adjustable to approach the final desired duty cycle time delay in response to a current duty cycle of the output clock signal, the delay circuit generating the reset signal after the flip-flop-circuit is set to a first state.

11. The duty cycle regulator of claim 10, wherein the flip-flop circuit includes a pair of cross-coupled logic gates, one of the cross-coupled logic gates having a set input for receiving the clock pulse signal and the other cross-coupled logic gate having a reset input for receiving the reset signal.

12. A duty cycle regulator for providing an output clock signal having a final desired duty cycle comprising:

a clock pulse generator having a clock edge detector responsive to a leading edge of an input clock signal, the clock pulse generator providing a clock pulse signal when the leading edge is detected;

a flip-flop circuit having a set input port for receiving the pulse signal, a reset input coupled to a reset signal, and an output port for generating the output clock signal; and a delay circuit for receiving the output clock signal and generating the reset signal after a time delay, the time delay being adjustable to approach the final desired duty cycle time delay in response to a current duty cycle of the output clock signal, the delay circuit generating the reset signal after the flip-flop-circuit is set to a first state, the delay circuit including a duty-cycle determination circuit for receiving the output clock signal, and for generating a corresponding delay control signal in response to the output clock signal, and a delayed pulse generator circuit for receiving said delay control signal and the output clock signal, for providing the reset signal.

13. The duty cycle regulator of claim 12, wherein the delay circuit further includes a sub-harmonic correction circuit for receiving the input clock signal and the output clock signal, the sub-harmonic correction circuit driving said delay control signal to a voltage level.

14. The duty cycle regulator of claim 13, wherein the sub-harmonic correction circuit includes an edge-triggered flip-flop circuit having a D-Input for receiving the output clock signal, a trigger input for receiving the input clack signal, and an output port for providing a control signal, and a driver receiving the control signal for coupling the voltage level to the delay control signal in response to the control signal, the control signal being generated when the input clock signal and the output clock signal are at the same logic level.

15. The duty cycle regulator of claim 12, wherein the duty-cycle determination circuit includes a low pass filter, a first charge pump for feeding electric charge into said low-pass filter, a second charge pump for draining electric charge out of said low-pass filter, first and second switching means for respectively and alternately turning, said first and second charge pumps on and off in response to level changes in the output clock signal, the delay control signal being generated at the low-pass filter.

16. The duty cycle regulator of claim 15, wherein a fraction of the period of the input clock signal is adjustable by setting a predetermined ratio of electric currents of the first charge pump relative to the second charge pump.

17. The duty cycle regulator of claim 12, wherein the delayed pulse generator circuit includes a current-starved inverter having two input ports coupled to receive the output clock signal and the delay control signal respectively, and a middle port for driving a buffer circuit, the reset signal being generated when the delay control signal reaches a predetermined threshold subsequent to a change in the logic level of the output clock signal.

* * * * *